(12) United States Patent
Haque et al.

(10) Patent No.: US 10,522,628 B2
(45) Date of Patent: Dec. 31, 2019

(54) APPARATUS WITH GRAPHENE LAYERS INTERCALATED WITH ION GEL

(71) Applicant: Nokia Technologies Oy, Espoo (FI)

(72) Inventors: Samiul Md Haque, Cambridge (GB); Alan Colli, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 196 days.

(21) Appl. No.: 15/519,962

(22) PCT Filed: Oct. 12, 2015

(86) PCT No.: PCT/FI2015/050681
§ 371 (c)(1),
(2) Date: Apr. 18, 2017

(87) PCT Pub. No.: WO2016/062916
PCT Pub. Date: Apr. 28, 2016

(65) Prior Publication Data
US 2017/0323945 A1    Nov. 9, 2017

(30) Foreign Application Priority Data

Oct. 21, 2014  (EP) .................................... 14189782

(51) Int. Cl.
*H01L 29/16*   (2006.01)
*H01L 29/423*  (2006.01)
(Continued)

(52) U.S. Cl.
CPC .... *H01L 29/1606* (2013.01); *H01L 29/42316* (2013.01); *H01L 29/66045* (2013.01); *H01L 29/778* (2013.01); *H01L 31/028* (2013.01); *H01L 51/0529* (2013.01); *H01L 51/0541* (2013.01); *Y02E 10/547* (2013.01)

(58) Field of Classification Search
CPC ........... H01L 29/1606; H01L 29/42316; H01L 29/66045
See application file for complete search history.

(56) References Cited

U.S. PATENT DOCUMENTS

2012/0328956 A1    12/2012  Oguni et al.
2015/0364472 A1*   12/2015  Kim .................... H01L 27/1237
                                                    257/29

FOREIGN PATENT DOCUMENTS

| KR | 101 348 169    | 1/2014 |
| WO | 2013/048347 A1 | 4/2013 |
| WO | 2014104156     | 7/2014 |

OTHER PUBLICATIONS

International Search Report and Written Opinion received for corresponding Patent Cooperation Treaty Application No. PCT/FI2015/050681, dated Jan. 18, 2016, 12 pages.

(Continued)

*Primary Examiner* — Hoai V Pham
(74) *Attorney, Agent, or Firm* — Harrington & Smith

(57) ABSTRACT

A multilayer graphene composite comprising a plurality of stacked graphene layers separated from one another by an ion gel, wherein the ion gel is intercalated between adjacent graphene layers such that ions within the ion gel are able to arrange themselves at the surfaces of the graphene layers to cause a detectable change in one or more of an electrical and optical property of the graphene layers when a gate voltage is applied to a gate electrode in proximity to the ion gel.

16 Claims, 6 Drawing Sheets

(51) Int. Cl.
    *H01L 29/66*     (2006.01)
    *H01L 51/05*     (2006.01)
    *H01L 31/028*     (2006.01)
    *H01L 29/778*     (2006.01)

(56) References Cited

OTHER PUBLICATIONS

J. Ye et al. "Accessing the transport properties of graphene and its multilayers at high carrier density", Proceedings of the National Academy of Sciences, vol. 108, No. 32, Aug. 9, 2011.

Kim S.H. et al. "Electrolyte-Gated Transistors for Organic and Printed Electronics", Advanced materials, Wiley—V C H Verlag Gybh & Co. KGAA, DE, vol. 25, No. 13, Apr. 4, 2013, pp. 1822-1846.

Lee et al., "'Cut and Stick' Rubbery Ion Gels as High Capacitance Gate Dielectrics", Advanced Materials, vol. 24, No. 32, 2012, pp. 4457-4462.

Cho et al., "High-Capacitance Ion Gel Gate Dielectrics With Faster Polarization Response Times for Organic Thin Film Transistors", Advanced Materials, vol. 20, No. 4, 2008, pp. 686-690.

Misra et al., "Electric Field Gating With Ionic Liquids", Applied Physics Letters, vol. 90, No. 5, 2007, pp. 052905-1-352905-3.

Uesugi et al., "Electric Double-layer Capacitance Between an Ionic Liquid and Few-layer Graphene", Scientific Reports, Apr. 3, 2013, pp. 1-5.

Miyazaki et al., "Inter-layer Screening Length to Electric Field in Thin Graphite Film" Applied Physics Express, vol. 1, No. 3, Mar. 2008, 5 Pages.

Khrapach et al., "Novel Highly Conductive and Transparent Graphene-based Conductors", Advanced Materials, vol. 24, 2012, pp. 2844-2849.

Liu et al., "A Graphene-based Broadband Optical Modulator", Nature, vol. 474, Jun. 2, 2011, pp. 64-67.

Han et al., "Scalable, Printable, Surfactant-Free Graphene Ink Directly From Graphite", Nanotechnology, vol. 24, Apr. 23, 2013, pp. 1-7.

Cho et al., "Printable Ion-gel Gate Dielectrics for Low-voltage Polymer Thin-film Transistors on Plastic" Nature Materials, vol. 7, Nov. 2008, pp. 900-906.

Lee et al., "Stretchable Graphene Transistors With Printed Dielectrics and Gate Electrodes", Nano Letters, vol. 11, 2011, pp. 4642-4646.

Kim et al., "High-performance Flexible Graphene Field Effect Transistors with Ion Gel Gate Dielectrics", Nano Letters, vol. 10, 2010, pp. 3464-3466.

Yan et al., "Graphene-based Flexible and Stretchable Thin film Transistors", Nanoscale, vol. 4, 2012, pp. 4870-4882.

Liu et al., "Double-layer Graphene Optical Modulator", Nano Letters, vol. 12, No. 3, 2012, 4 Pages.

"Rogers Research Group", Rogers Group, Retrieved on Apr. 25, 2017, Webpage available at : http://rogersgroup.northwestern.edu/.

Extended European Search Report received for corresponding European Patent Application No. 14189782.7, dated Apr. 29, 2015, 5 pages.

\* cited by examiner

APPARATUS WITH GRAPHENE LAYERS INTERCALATED WITH ION GEL

RELATED APPLICATION

This application was originally filed as PCT Application No. PCT/FI2015/050681 filed Oct. 12, 2015, which claims priority benefit from EP Patent Application No. 14189782.7, filed Oct. 21, 2014.

TECHNICAL FIELD

The present disclosure relates particularly to the field of optoelectronic applications, associated methods and apparatus, and specifically concerns a multilayer graphene composite. Certain embodiments relate to a multilayer graphene composite comprising an ion gel configured for use as a gate dielectric, for example, in optoelectronic applications. Certain disclosed example aspects/embodiments relate to field-effect transistors, smart windows and portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new materials with improved physical and electrical properties for use in device applications.

The listing or discussion of a prior-published document or any background in this specification should not necessarily be taken as an acknowledgement that the document or background is part of the state of the art or is common general knowledge.

SUMMARY

According to a first aspect, there is provided a multilayer graphene composite comprising a plurality of stacked graphene layers separated from one another by an ion gel, wherein the ion gel is intercalated between adjacent graphene layers such that ions within the ion gel are able to arrange themselves at the surfaces of the graphene layers to cause a detectable change in one or more of an electrical and optical property of the graphene layers when a gate voltage is applied to a gate electrode in proximity to the ion gel.

The graphene layers of the stack may be in the form of one or more of a graphite crystal, single layers of graphene, and a percolation network of graphene flakes.

The ion gel may comprise a combination of polystyrene-poly(methyl methacrylate)-polystyrene and 1-ethyl-3-methylimidazolium bis(trifluoromethylsulfonyl)imide.

According to a further aspect, there is provided an apparatus comprising any multilayer graphene composite described herein and a gate electrode in proximity to the ion gel configured to cause a detectable change in one or more of an electrical and optical property of the graphene layers when a gate voltage is applied to the gate electrode.

The apparatus may comprise source and drain electrodes configured to enable a flow of electrical current from the source electrode through the plurality of stacked graphene layers to the drain electrode, and the apparatus may be configured such that the arrangement of ions at the surfaces of the graphene layers in response to the applied gate voltage causes a detectable change in the flow of electrical current. Such embodiments could be considered to relate to field-effect transistors.

The apparatus may comprise a ground electrode configured to supply the plurality of stacked graphene layers with electric charge, and the apparatus may be configured such that the arrangement of ions at the surfaces of the graphene layers in response to the applied gate voltage causes a detectable change in the transparency of the graphene layers. Such embodiments could be considered to relate to smart windows.

The ground electrode may comprise one or more of the source and drain electrodes.

The apparatus may have one of a side-gate configuration in which the gate electrode is adjacent to the plurality of graphene layers, and a top-gate configuration in which the gate electrode overlies the plurality of graphene layers.

The gate electrode may be one or more of in contact with the ion gel of the multilayer graphene composite, and at least partially immersed in the ion gel of the multilayer graphene composite.

The gate electrode may be configured to have a surface area which is substantially the same as the combined surface area of the plurality of graphene layers.

The gate electrode may be configured to have a surface area which is one or more of 50-150%, 75%-125% and 90-110% of the combined surface area of the plurality of graphene layers.

The gate electrode may comprise a multilayer graphene composite comprising a plurality of stacked graphene layers separated from one another by an intercalating ion gel.

The gate electrode may have a generally planar structure.

The generally planar structure may comprise one or more of pores and protrusions configured to increase its surface area.

The gate electrode may comprise one or more of microparticles and nanoparticles.

The gate electrode may comprise one or more of a metal, an alloy, copper, gold, silver, chromium, indium tin oxide, graphene, carbon nanotubes and activated carbon.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a smart window, a field-effect transistor, and a module for one or more of the same.

According to a further aspect, there is provided a method comprising:

forming a multilayer graphene composite comprising a plurality of stacked graphene layers separated from one another by an ion gel, wherein the ion gel is intercalated between adjacent graphene layers such that ions within the ion gel are able to arrange themselves at the surfaces of the graphene layers to cause a detectable change in one or more of an electrical and optical property of the graphene layers when a gate voltage is applied to a gate electrode in proximity to the ion gel.

Forming the multilayer graphene composite may comprise mixing graphene ink with an ion gel to produce a solution-processable composite usable to deposit the multilayer graphene composite.

Forming the multilayer graphene composite may comprise the repeated and sequential deposition of a graphene layer followed by an ion gel layer.

The ion gel may be formed from a combination of ionic liquid (e.g. 1-ethyl-3-methylimidazolium bis(trifluoromethylsulfonyl)imide), block copolymer (e.g. polystyrene-poly(methyl methacrylate)-polystyrene) and solvent (e.g. ethylacetate).

The method may comprise:
forming a gate electrode in proximity to the ion gel of the multilayer graphene composite to enable the application of a gate voltage.

According to a further aspect, there is provided a method comprising:
applying a gate voltage to a gate electrode in proximity to an ion gel of a multilayer graphene composite, the multilayer graphene composite comprising a plurality of stacked graphene layers separated from one another by the ion gel, wherein the ion gel is intercalated between adjacent graphene layers such that ions within the ion gel are able to arrange themselves at the surfaces of the graphene layers to cause a detectable change in one or more of an electrical and optical property of the graphene layers when the gate voltage is applied to the gate electrode.

The steps of any method disclosed herein do not have to be performed in the exact order disclosed, unless explicitly stated or understood by the skilled person.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

DESCRIPTION OF SPECIFIC ASPECTS/EMBODIMENTS

One or more disclosed embodiments of the present apparatus relate to field-effect transistors. A field-effect transistor is a type of transistor in which an electrical current is carried along a conduction channel, the conductance (or conductivity) of which can be controlled by a transverse electric field.

Figure 1:
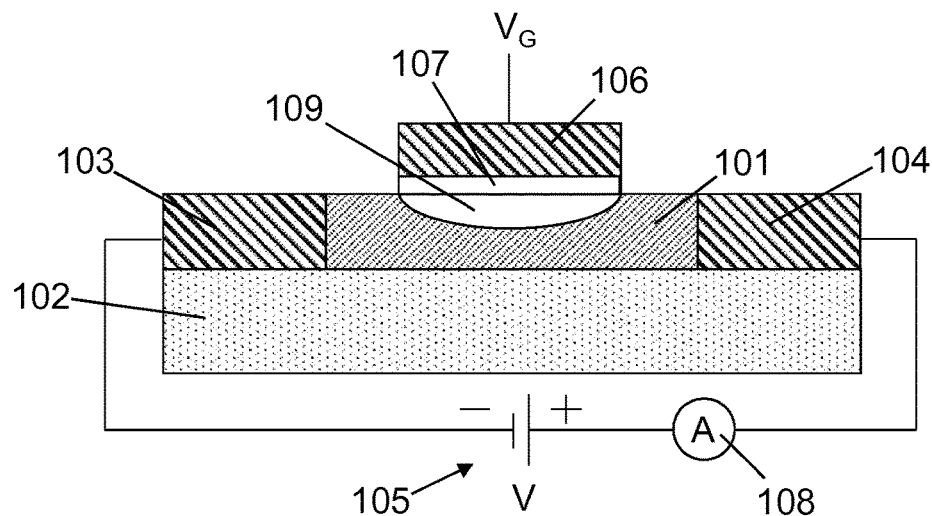
FIG. 1 shows a conventional field-effect transistor (cross-section)

FIG. 1 shows a conventional field-effect transistor in cross-section. As shown in this figure, a metal or semiconductor channel 101 (such as p-type silicon) is supported on a substrate 102 and connected to metal source 103 and drain 104 electrodes. A current is injected and collected via the source 103 and drain 104 electrodes, respectively, by applying a potential difference (V) 105 across the channel 101. The conductance of the channel 101 between the source 103 and drain 104 electrodes is switched on and off by a third electrode (the gate electrode 106) capacitively coupled through a thin dielectric layer 107. The conductance may be determined by measuring the current through the channel 101 (using an ammeter 108, for example) and dividing by the potential difference (V) 105. With p-type silicon (or another p-type semiconductor), application of a positive gate voltage ($V_G$) depletes the charge carriers (creating a depletion region 109 in the channel 101) and reduces the conductance, whilst applying a negative gate voltage ($V_G$) leads to an accumulation of charge carriers (creating a conductive region) and an increase in conductance.

Ionic liquids consisting of low molar mass cations and anions may be used as high-capacitance gate dielectrics 107 in field-effect transistors. The primary figure of merit for a gate dielectric 107 is the specific capacitance, as the charge induced in the transistor channel 101 is directly proportional to capacitance ($Q = C \times (V_G - V_T)$, where Q is the electric charge, C is the capacitance, $V_G$ is the applied gate voltage, and $V_T$ is the threshold voltage). The advantage of using ionic liquid dielectrics compared to solid state dielectrics is a significantly enhanced charge modulation for the same gate voltage.

Figure 2:
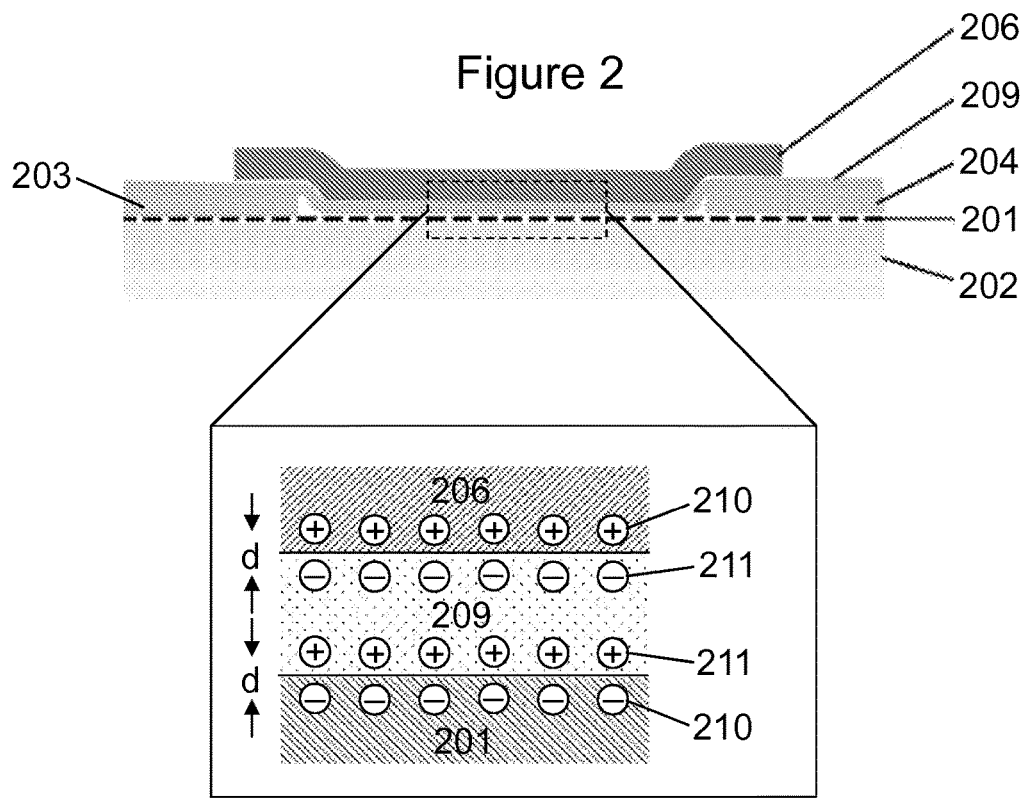
FIG. 2 shows a field-effect transistor comprising an ionic liquid gate dielectric (cross-section)

FIG. 2 shows a field-effect transistor in cross-section comprising an ionic liquid gate dielectric 209. As illustrated in this figure, the enhanced charge modulation in the channel 201 is due to an electric double-layer that is produced at the interface of the metal or semiconductor 201 with the ionic liquid 209. An electric double-layer is a structure that forms at the surface of a charged object when it is in contact with a fluid. The charges 210 on the surface of the object at the object-fluid interface attract oppositely charged ions 211 in the fluid towards the surface charge 210. The ions 211 then arrange themselves at the interface to mirror the surface charge 210 and form an insulating structure. In an electric double-layer (i.e. a layer of surface charge 210 and a layer of ions 211), the separation d of the surface charge 210 and ions 211 is on the order of nanometres. This small separation results in a large capacitance at the object-fluid interface, a feature which is exploited in supercapacitors.

By using ionically conducting but electrically insulating ionic liquids 209 as gate dielectrics, the number of charge carriers in a transistor channel 201 can be tuned beyond $10^{14}$ $cm^{-2}$. Accessing such large carrier densities by ionic liquid gating is useful for examining transport behaviour and critical phenomena (e.g. the insulator-to-metal transition) in semiconductors. The compensating disadvantage is a slower relaxation time.

Ionic liquid gates 209 may also be used to induce large carrier densities in graphene, far beyond what is normally possible with conventional electrostatic gates. Whilst it seems that ionic liquid doping will still be insufficient to reach the van Hove singularity at M-points (where several novel phenomena such as superconductivity and ferromagnetism have been predicted), it is strong enough to move the Fermi level well away from the Dirac point, altering in a significant way the electrical and optical properties of single-layer graphene.

One of the most useful features of single-layer graphene is that its conductivity can be modulated by some kind of external doping. Such doping can be introduced by chemical functionalization, electrostatic gating or ionic liquid gating, as explained above. Single-layer graphene is not the only technologically-relevant implementation of two-dimensional sp2 carbon. Multilayer graphene may be exploited for applications that require a lower sheet resistance or higher optical absorption than single-layer graphene. When it comes to multilayer graphene, however, efficient conductivity tuning becomes increasingly difficult as the number of layers increases.

The definition of multilayer graphene is fairly broad, and can be thought to include any of the following: 1) a thin graphite crystal made of a few atomic planes, intimately stacked according to the standard ABAB sequence; 2) a stack of several single graphene layers separated by an arbitrary distance (and possibly intercalated by other compounds or materials) without any inter-layer crystallographic relationship; and 3) an assembly of micron-sized graphene flakes forming a film which allows current transport via percolation through multiple flakes. The latter is a low cost alternative to large-area graphene, and can be prepared or printed from a "graphene ink" solution.

Figure 3:
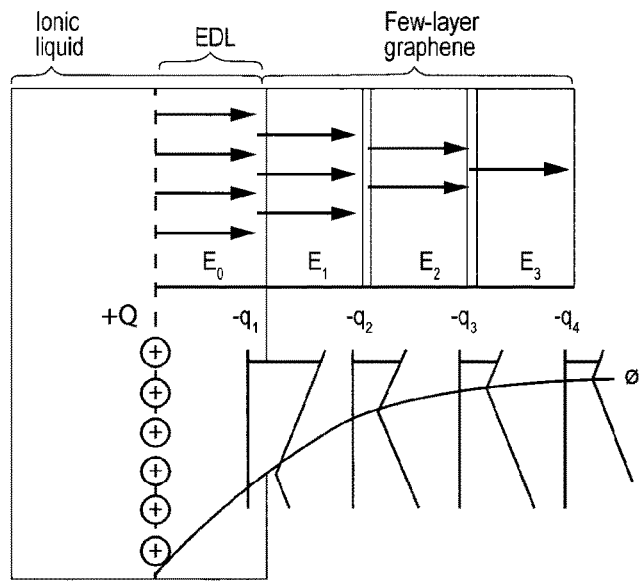
FIG. 3 shows the typical charge distribution within a multilayer graphene channel separated from a gate electrode by an ionic liquid (cross-section)

FIG. 3 shows the typical charge distribution within a multilayer graphene channel separated from a gate electrode by an ionic liquid. As illustrated in this figure, the electric field ($E_0$-$E_3$) applied by the ionic charge (+Q) at the top of the stack is screened by the charge (-$q_1$--$q_4$) distributed within 3-4 layers of graphene. As a result, an electric double layer (EDL) is only formed at the interface between the ionic liquid and the outermost layer of graphene, and the strength of the electric field ($E_0$-$E_3$) decreases with each graphene layer. This makes it difficult to vary the conductivity of the channel. Although there are means to intercalate some chemical functionalization that can result in an overall high-doping of multilayer graphene, this approach can only deliver a fixed amount of doping that cannot be modulated later by external drives.

There will now be described a multilayer graphene composite and associated methods and apparatus that may or may not provide a solution to this issue.

Figure 4A:
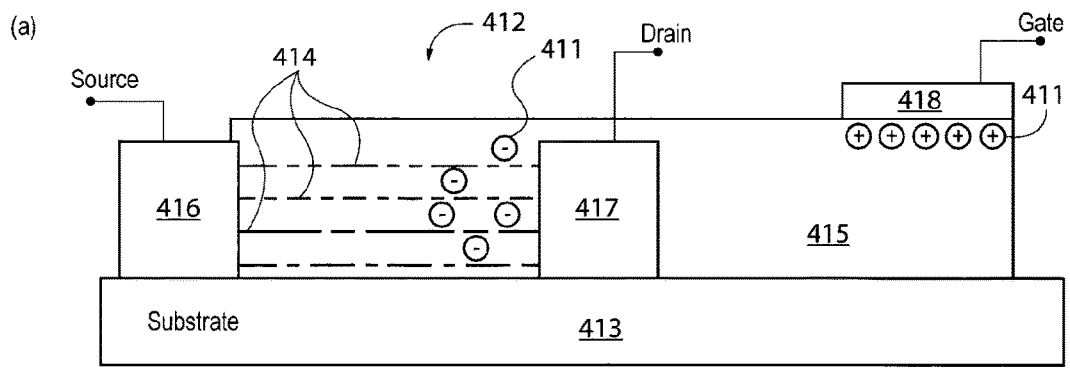
FIG. 4a shows an apparatus comprising a multilayer graphene composite according to one embodiment of the present disclosure (cross-section)

FIG. 4a shows an apparatus (in cross-section) according to one embodiment of the present disclosure which comprises a multilayer graphene composite 412 supported on a substrate 413. The multilayer graphene composite 412 comprises a plurality of stacked graphene layers 414 separated from one another by an ion gel 415. An ion gel 415 is a relatively new material in which an ionic liquid (discussed above) is immobilised inside a polymer matrix by polymerisation of a block copolymer with the ionic liquid. For example, the ion gel 415 may comprise a combination of polystyrene-poly(methyl methacrylate)-polystyrene and 1-ethyl-3-methylimidazolium bis(trifluoromethylsulfonyl) imide formed by mixing the block copolymer and ionic liquid together in a solvent such as ethylacetate and allowing the mixture to dry. This allows the design of novel materials that combine high ionic conductivity with the easy handling properties of the solid state.

In this example, the apparatus is a field-effect transistor comprising source 416 and drain 417 electrodes configured to enable a flow of electrical current from the source electrode 416 through the plurality of stacked graphene layers 414 to the drain electrode 417. To achieve this functionality, the source 416 and drain 417 electrodes may extend through the thickness of the multilayer graphene composite 412 (as shown) to contact as many of the graphene layers 414 as possible. The apparatus also comprises a gate electrode 418 configured to enable the flow of electrical current to be controlled by the application of a gate voltage to the gate electrode 418. The gate electrode 418 and graphene stack essentially form a capacitor with the ion gel dielectric 415. Before a gate voltage is applied, the ions 411 within the ion gel 415 may be randomly arranged (or pseudo-randomly arranged) to reduce the energy of the system. When a gate voltage is applied, however, ionic charges 411 within the ion gel 415 move to the gate electrode 418 to screen the gate voltage leaving a complementary amount of charge 411 on the graphene stack which affects its conductivity via a field-effect.

Importantly, the ion gel 415 of the multilayer graphene composite 412 is intercalated between adjacent graphene layers 414. In this way, ions 411 within the ion gel 415 are able to move in and out of the multilayer graphene structure and arrange themselves at the surfaces of the graphene layers 414 when a gate voltage is applied to the gate electrode 418. This feature allows electric double-layers to be produced at the surface of each graphene layer 414 in the stack causing a detectable change in the flow of electrical current.

To allow capacitive coupling between the gate electrode 418 and the graphene layers 414, the gate electrode 418 must be in proximity to the ion gel 415 of the multilayer graphene composite 412 to form an electric double-layer at the gate electrode-ion gel interface (which in turn causes the formation of an electric double-layer at the graphene-ion gel interface). For example, the gate electrode 418 may be in contact with the ion gel 415, or it may be partially or fully immersed in the ion gel 415. In the example shown in FIG. 4a, the ion gel 415 of the multilayer graphene composite 412 (i.e. without graphene layers 414) is extended beyond the source 416 and drain 417 electrodes, and the gate electrode 418 is formed on the surface of the graphene-free ion gel 415.

Unlike the examples shown in FIGS. 1 and 2 in which the gate electrode 106, 206 overlies the channel 101, 201 (i.e. a top-gate configuration), the apparatus of FIG. 4a comprises a side-gate configuration in which the gate electrode 418 is adjacent to the plurality of graphene layers 414. This arrangement is achievable with an ion gel 415 because the electric double-layers are produced at the graphene-gel interfaces regardless of the relative positions of the graphene stack and the gate electrode 418. The ion gel 415 therefore ensures efficient coupling even if the gate electrode 418 is not in proximity to the graphene layers 414. Nevertheless, it is also possible to form the gate electrode 418 on top of the ion gel 415 such that it overlies the plurality of graphene layers 414 (i.e. top-gate configuration), if desired.

If the surface area of the gate electrode and channel of a field-effect transistor are similar, the areal charge density on both "plates" of the capacitor structure will be similar too, effectively mimicking a situation where the gate electrode is in very close proximity to the channel. When a conventional single-layer channel is replaced with a plurality of stacked graphene layers 414, however, the surface area of the channel increases dramatically. If the surface area of the gate electrode 418 is comparable to the surface area of a single layer 414 of the graphene stack, as shown in FIG. 4a, then the areal charge density on the complete channel structure will be far lower than the areal charge density on the gate electrode 418. In this scenario, the channel will respond as if the applied gate voltage is lower than it actually is.

To address this issue, the gate electrode 418 may be configured to have a surface area which is substantially the same as the combined surface area of the plurality of graphene layers 414. For example, the gate electrode 418 may be configured to have a surface area which is 50-150%, 75-125% or 90-110% of the combined surface area of the plurality of graphene layers 414. This would increase the capacitance of the gate for the same applied voltage. One way of achieving the greater surface area is to form the gate electrode 418 such that its planar area is much larger than the channel. However, this may be impractical for some applications, particularly in portable electronic devices where circuit board real-estate is often at a premium. Another option is to introduce one or more of pores and protrusions in the gate electrode 418 to increase its surface area. This can be achieved by forming the gate electrode 418 from a particulate material (e.g. carbon nanotubes or activated carbon), or by attaching one or more of microparticles and nanoparticles to the surface of the gate electrode 418. Yet another option is to form the gate electrode 418 from the multilayer graphene composite 412 used to form the channel.

Figure 4B:
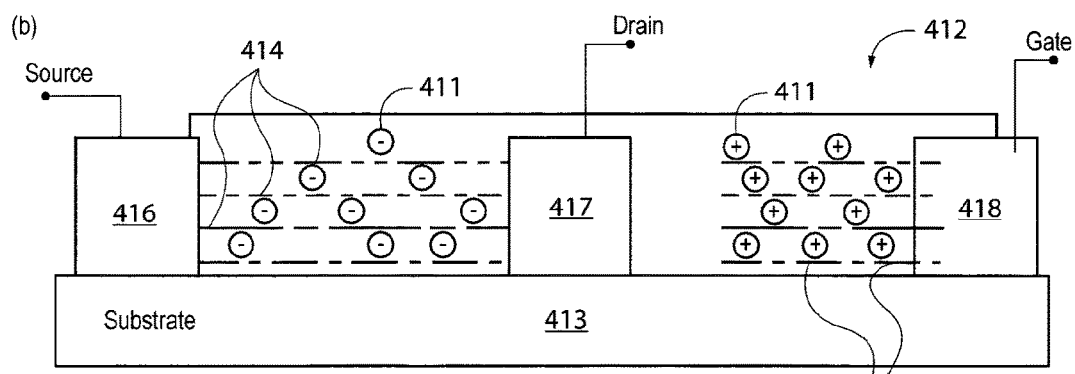
FIG. 4b shows an apparatus comprising a multilayer graphene composite according to another embodiment of the present disclosure (cross-section)

FIG. 4b shows another example of the present apparatus. Instead of the gate electrode 418 of FIG. 4a which has a generally planar structure, the gate electrode 418 of FIG. 4b comprises a multilayer graphene composite 412 comprising a plurality of stacked graphene layers 414 separated from one another by an intercalating ion gel 415. By using the multilayer graphene composite 412 to form the channel and the gate electrode 418, both "plates" of the capacitor structure have roughly the same surface area, providing greater capacitive coupling and a larger dynamic range of channel conductivity. The price is paid in terms of speed, as it takes longer for the greater number ions to diffuse to the gate electrode 418. With regard to electronic applications (e.g. analogue electronics), the apparatus would be effective in slow-switching or static operations where the doping of the channel needs to be varied by a large amount. A read-out circuit can be used for high speed electronic analysis and integration with conventional silicon-based electronics.

Another application of the multilayer graphene composite 412 described herein is smart windows. Smart windows (also known as smart glass, switchable glass and switchable windows) refers to glazing that changes its light transmission properties under the application of a voltage, light or heat. The absorption of visible and infrared light by single-layer graphene is approximated by the universal coefficient $\pi\alpha \sim 2.3\%$, where $\alpha$ is the fine structure constant. This means that, absent any interference effects with the substrate, the absorption by individual graphene layers 414 in multilayer graphene should add up, leading to an overall transmission given by $T(n)=(1-0.023)^n$, where n is the number of layers in the multilayer graphene stack. This is true for nominally intrinsic graphene, i.e. with the Fermi level close enough to the Dirac point to allow optical transitions between the valence and conductance "bands". To conserve momentum, the only optical transition allowed for a photon of energy E is to excite an electron from its occupied state at $-E/2$ under the Dirac point to the empty state at $E/2$ above the Dirac point. However, if the graphene is so heavily doped that the Fermi level lies more than $E/2$ from the Dirac point (either above or below), then the final state of the transition will be occupied (or the initial state will be empty), and thus the transition will be forbidden. This phenomenum is called Pauli blocking. In essence, it means that heavily-doped graphene is more transparent than intrinsic graphene.

Figure 5:
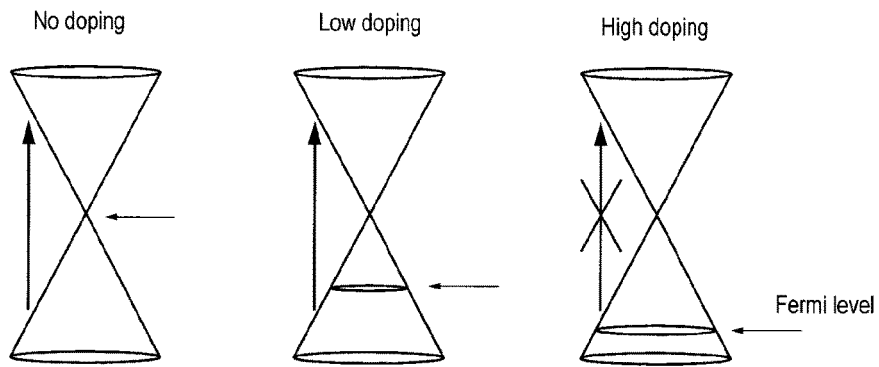
FIG. 5 illustrates the Pauli blocking phenomenon.

FIG. 5 illustrates the Pauli blocking phenomenon in single-layer graphene by showing that incident photons are absorbed by intrinsic (i.e. no doping) graphene causing electron transitions, but are not absorbed by highly-doped graphene resulting in greater optical transparency. Pauli blocking in graphene may therefore be used to create an electrically controlled optical modulator. If one could control the doping of graphene via a gate voltage, graphene could be switched between an opaque state and a transparent state, potentially at high speed. The problem is that, assuming the transparent state would allow 100% transmission in the desired optical band, the opaque state would still exhibit a transmission of around 97.7%, thus yielding a poor, and virtually invisible, optical contrast.

To achieve a contrast large enough for practical applications, one should ensure a transparent state with transmission no lower than 85-90% and an opaque state with a transmission lower than 50% (or better). To put this into context, 30 layers of ideal single-layer graphene would be needed to achieve a transmission lower than 50%. Furthermore, all of these 30 layers would need to be strongly gated to reach a highly doped state. The multilayer graphene composite described herein may allow these requirements to be satisfied.

Figure 6A:
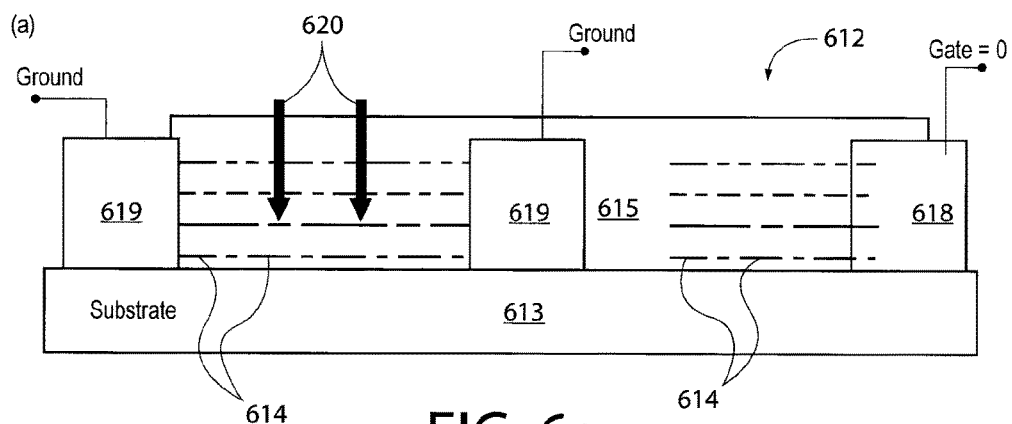
FIG. 6a shows an apparatus comprising a multilayer graphene composite according to another embodiment of the present disclosure (cross-section)

FIG. 6a shows an apparatus (in cross-section) according to another embodiment of the present disclosure which comprises a multilayer graphene composite 612 supported on a transparent substrate 613. The apparatus also comprises one or more ground electrodes 619 configured to supply the plurality of stacked graphene layers 614 with electric charge, and a gate electrode 618 configured to enable the application of a gate voltage. As with the embodiments shown in FIGS. 4a and 4b, the gate electrode 618 and graphene stack essentially form a capacitor with the ion gel dielectric 615. As shown in this figure, light photons 620 incident upon the graphene stack are absorbed when no gate voltage is applied (i.e. an opaque state).

Figure 6B:
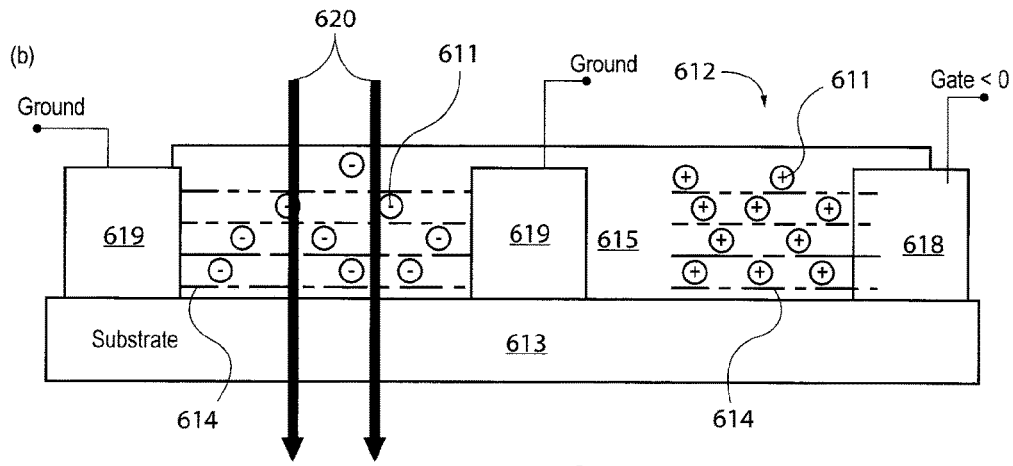
FIG. 6b shows the apparatus of FIG. 6a when a gate voltage is applied to the gate electrode.

FIG. 6b shows the apparatus of FIG. 6a when a gate voltage is applied to the gate electrode 618. As can be seen, ionic charges 611 within the ion gel 615 move to the gate electrode 618 to screen the gate voltage leaving a complementary amount of charge 611 on the graphene stack. This time, however, rather than causing a detectable change in the flow of electrical current through the multilayer graphene stack, the arrangement of ions 611 at the surfaces of the graphene layers 614 in response to the applied gate voltage causes a detectable change in the transparency of the graphene stack. This is represented by the passage of light photons 620 through the graphene layers 614 (i.e. a transparent state). In effect, the multilayer graphene stack switches from a less transparent state to a more transparent state when the gate voltage is applied due to the increased doping of the constituent layers. As before, the greatest effect is observed when the surface area of the gate electrode 618 is substantially the same as the combined surface area of the plurality of graphene layers 614. In this respect, the multilayer graphene composite 612 may be used advantageously to form the gate electrode 618 as well as the channel (as shown in FIGS. 6a and 6b).

Again, the price paid for this smart window to work is a relatively low speed of operation. The larger the surface area of the channel and gate electrode 618, the longer it takes to move sufficient charge to induce the necessary doping.

The ground electrodes 619 used in the apparatus of FIGS. 6a and 6b may comprise the source 416 and drain 417 electrodes described with reference to FIGS. 4a and 4b. In this respect, the apparatus of FIGS. 6a and 6b may be structurally identical to the apparatus of FIGS. 4a and 4b, but with the source 416 and drain 417 electrodes held at 0V. In practice, though, only one electrode 619 may be required in order to ground the graphene layers 614. Furthermore, although the apparatus may have a top-gate configuration instead of the side-gate configuration shown in FIGS. 6a and 6b, the side-gate configuration may be preferable to avoid the absorption or scattering of light photons 620 by the gate electrode 618 in the transparent state. That said, the material and/or thickness of the gate electrode 618 could be chosen to increase its transparency (e.g. by using indium tin oxide). One or more of the gate 618, ground 619, source 416 and drain 417 electrodes described herein may be formed from a metal, an alloy, copper, gold, silver, chromium, indium tin oxide, graphene, carbon nanotubes or activated carbon.

Capacitive measurements were performed using two different capacitor structures (not shown) by applying a sinusoidal signal to test the behaviour of the ion gel dielectric (without multilayer graphene stack) over a range of different operational frequencies. The first capacitor comprised two gold electrodes separated from one another by a 1 mm thick layer of ion gel and arranged to form a stack (i.e. a metal-insulator-metal structure), whilst the second capacitor comprised silver interdigitated electrodes onto which a layer of ion gel was deposited. The interdigitated electrodes of the second capacitor were 400 μm wide with a 400 μm gap. The ion gel was formed using PS-PMMA-PS as the block copolymer, [EMIM][TFSI] as the ionic liquid and ethylacetate as the mixing solvent. During these tests, a Fluke LCR meter was used to measure the capacitance of the devices, which was calibrated using conventional solid-state capacitors.

Figure 7A:
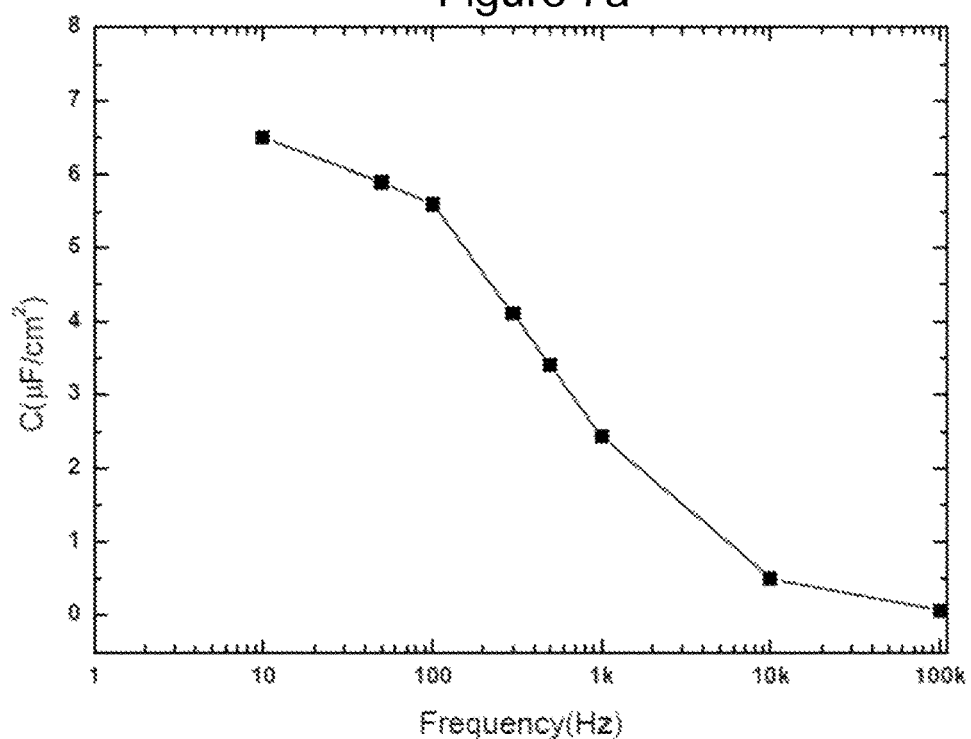
FIG. 7a shows how the capacitance of a stacked ion gel capacitor varies with operational frequency.
Figure 7B:
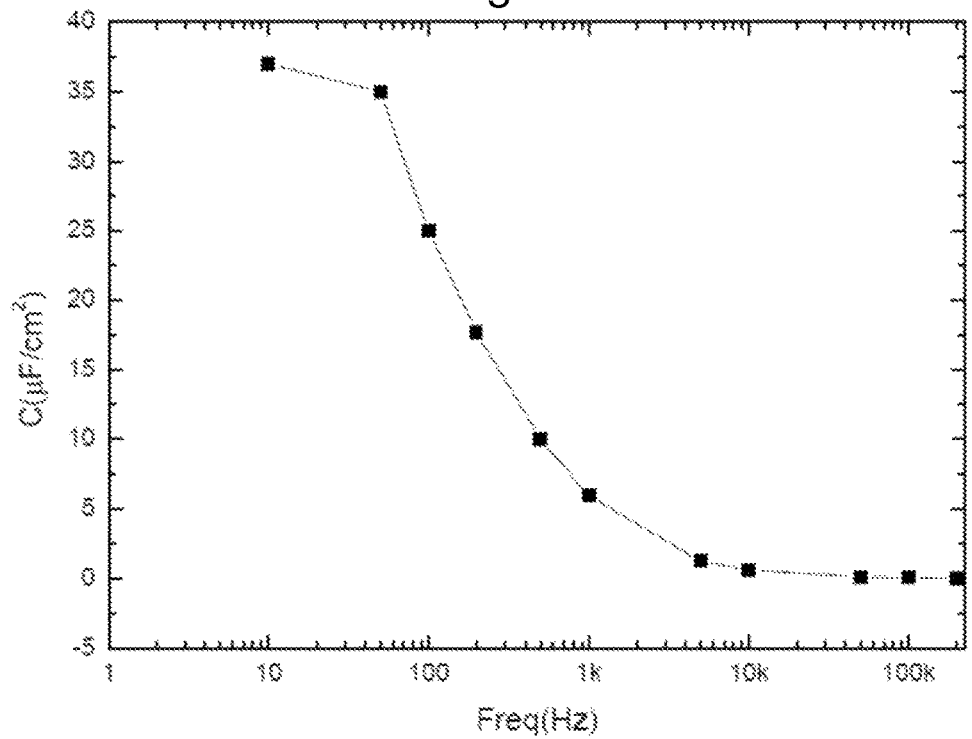
FIG. 7b shows how the capacitance of an interdigitated ion gel capacitor varies with operational frequency.

FIGS. 7a and 7b show the experimental results of the capacitance measurements for the first and second capacitors, respectively. These results show that an ion gel, when deposited between two electrodes, can exhibit a capacitance as high as 37 μF/cm$^2$. The operational performance of a device can be extrapolated from this result suggesting a capacitance of a few nFs to a few 10s of pFs, which allows device coupling. As can be seen, the capacitance of both devices decreased with frequency. The first capacitor exhibited a capacitance of around 6.5 μF/cm$^2$ at 10 Hz, which decreased to zero at 100 kHz. Similarly, the second capacitor exhibited a capacitance of around 37 μF/cm$^2$ at 10 Hz, which decreased to 100s of nFs to a few 10s of pFs at 100 kHz. Solid state capacitors have capacitances in the nF-pF range at 10 Hz, or even no capacitive coupling when the electrode gaps are on the order of 1 mm, for example. The typical specific capacitance of existing ion gel capacitors is over 6.5 μF/cm$^2$ at 100 Hz, which represents a factor increase of more than 40 over solid-state dielectric capacitors. A typical solid-state dielectric capacitor with a thickness of 1 μm and a dielectric constant of 3 exhibits a specific capacitance of around 0.025 μF/cm$^2$. This behaviour renders ion gels suitable for use in the applications described herein.

Figure 8:
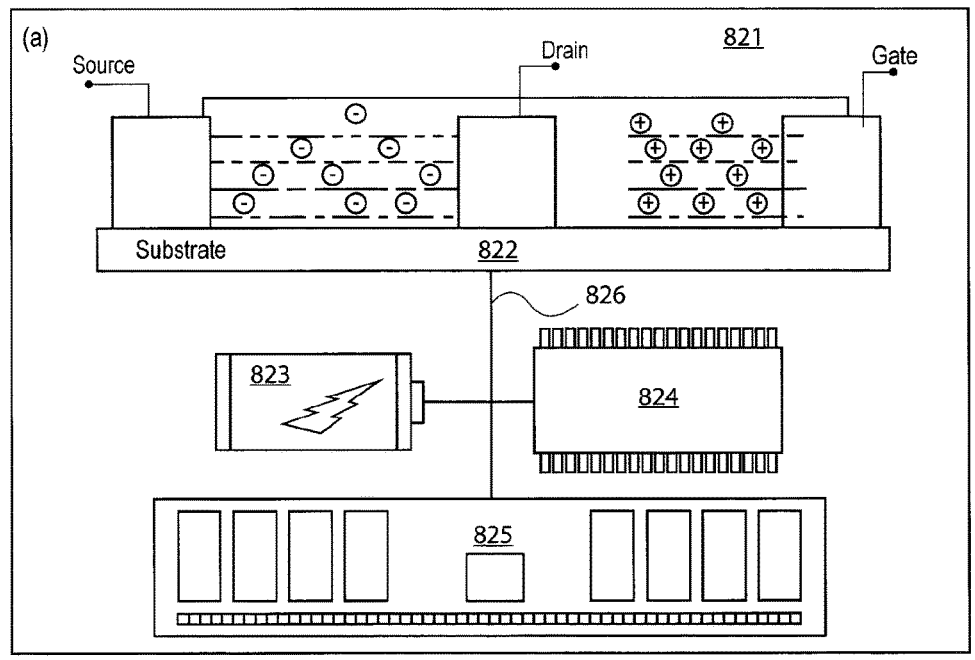
FIG. 8 shows an apparatus comprising a multilayer graphene composite according to another embodiment of the present disclosure (schematic)

FIG. 8 shows an apparatus 821 comprising a multilayer graphene composite according to another embodiment of the present disclosure (schematic). The apparatus 821 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, and a module for one or more of the same. In the example shown, the apparatus 821 comprises a field-effect transistor 822 (as described with reference to FIGS. 4a and 4b), a power source 823, a processor 824 and a storage medium 825, which are electrically connected to one another by a data bus 826.

The processor 824 is configured for general operation of the apparatus 821 by providing signalling to, and receiving signalling from, the other components to manage their operation. The storage medium 825 is configured to store computer code configured to perform, control or enable operation of the apparatus 821. The storage medium 825 may also be configured to store settings for the other components. The processor 824 may access the storage medium 825 to retrieve the component settings in order to manage the operation of the other components.

Under the control of the processor 824, the power source 823 is configured to apply a voltage between the source and drain electrodes to enable a flow of electrical current from the source electrode through the plurality of stacked graphene layers to the drain electrode, and apply a gate voltage to the gate electrode to cause a detectable change in the flow of electrical current. In this way, the field-effect transistor 822 may act as an electronic switch within the circuitry of the apparatus 821.

The processor 824 may be a microprocessor, including an Application Specific Integrated Circuit (ASIC). The storage medium 825 may be a temporary storage medium such as a volatile random access memory. On the other hand, the storage medium 825 may be a permanent storage medium 825 such as a hard disk drive, a flash memory, or a non-volatile random access memory. The power source 823 may comprise one or more of a primary battery, a secondary battery, a capacitor, a supercapacitor and a battery-capacitor hybrid.

Figure 9:
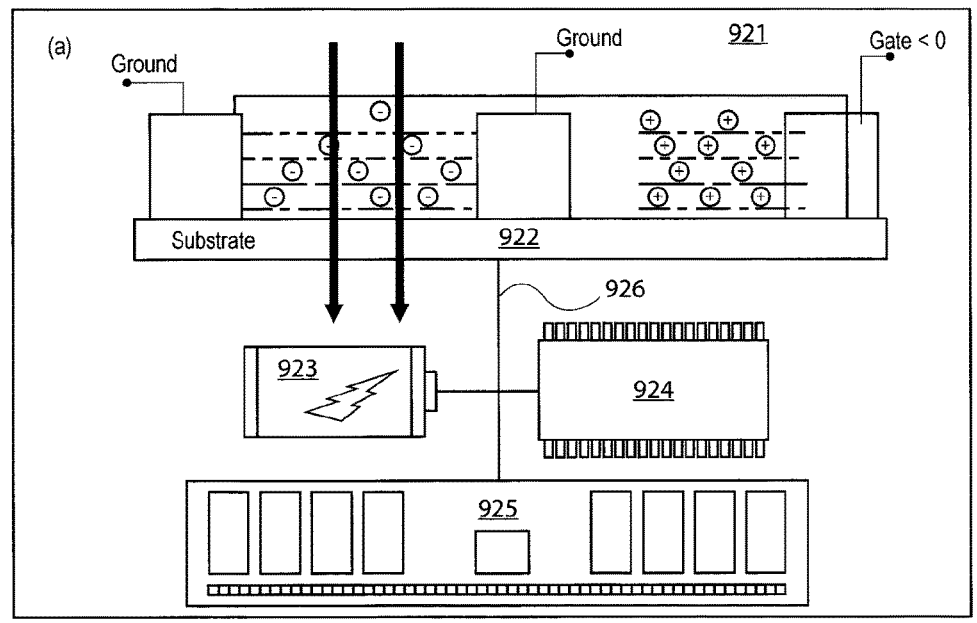
FIG. 9 shows an apparatus comprising a multilayer graphene composite according to another embodiment of the present disclosure (schematic)

FIG. 9 shows an apparatus 921 comprising a multilayer graphene composite according to another embodiment of the present disclosure (schematic). The apparatus 921 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, and a module for one or more of the same. In the example shown, the apparatus 921 comprises a smart window 922 (as described with reference to FIGS. 6a and 6b), a power source 923, a processor 924 and a storage medium 925, which are electrically connected to one another by a data bus 926. The processor 924, storage medium 925 and power source 923 are as described with reference to FIG. 8 above.

Under the control of the processor, the power source 923 is configured to ground the ground electrode, and apply a gate voltage to the gate electrode to cause a detectable change in the transparency of the graphene layers. In this way, the smart window 922 may be switched between an opaque state and a transparent state to control the transmission of light through the apparatus 921.

Figure 10:
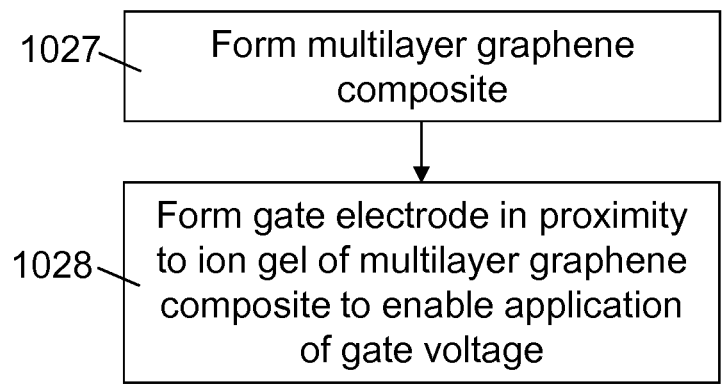
FIG. 10 shows the main steps of a method of making an apparatus described herein.

The main steps 1027-1028 of a method of making an apparatus described herein are shown schematically in FIG. 10. The method generally comprises: forming a multilayer graphene composite 1027; and forming a gate electrode in proximity to an ion gel of the multilayer graphene composite to enable the application of a gate voltage 1028.

The multilayer graphene composite may be formed in a number of different ways. One such method involves the repeated and sequential deposition of a graphene layer (e.g. by chemical vapour deposition) followed by an ion gel layer. Another method involves mixing graphene ink with an ion gel to produce a solution-processable composite usable to deposit the multilayer graphene composite (e.g. by printing or spin-casting). The ion gel itself may be formed by mixing a block copolymer (e.g. PS-PMMA-PS) with an ionic liquid (e.g. [EMIM][TFSI]) and a solvent (e.g. ethylacetate) overnight; evaporating the resulting solution to produce the ion gel; and leaving the ion gel for several hours to dry.

Figure 11:
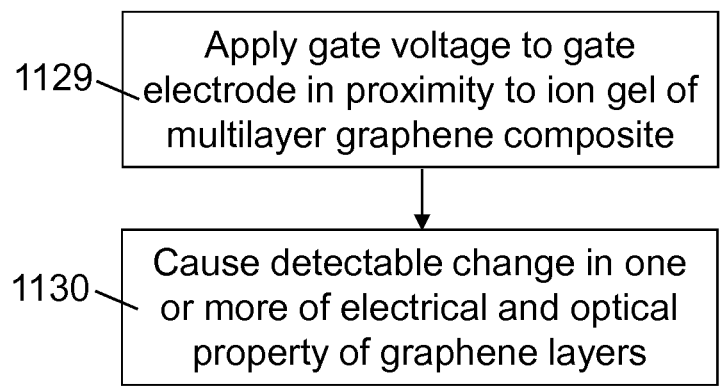
FIG. 11 shows the main steps of a method of using an apparatus described herein.

The main steps 1129-1130 of a method of using an apparatus described herein are shown schematically in FIG. 11. The method generally comprises: applying a gate voltage to a gate electrode in proximity to the ion gel of a multilayer graphene composite 1129; and causing a detectable change in one or more of an electrical and optical property of the graphene layers 1130.

Figure 12:
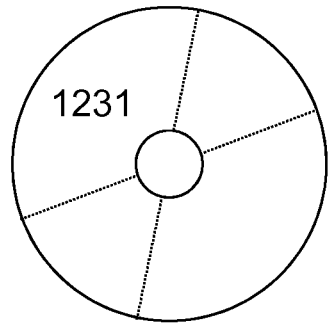
FIG. 12 shows a computer-readable medium comprising a computer program configured to perform, control or enable one or more of the method steps of FIG. 10 or 11.

FIG. 12 illustrates schematically a computer/processor readable medium 1231 providing a computer program according to one embodiment. The computer program may comprise computer code configured to perform, control or enable one or more of the method steps 1027-1028 of FIG. 10 and/or one or more of the method steps 1129-1130 of FIG. 11. In this example, the computer/processor readable medium 1231 is a disc such as a digital versatile disc (DVD) or a compact disc (CD). In other embodiments, the computer/processor readable medium 1231 may be any medium that has been programmed in such a way as to carry out an inventive function. The computer/processor readable medium 1231 may be a removable memory device such as a memory stick or memory card (SD, mini SD, micro SD or nano SD).

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

Research leading to these results has received funding from the European Union Seventh Framework Programme under grant agreement n°604391 Graphene Flagship.

The invention claimed is:

1. A multilayer graphene composite comprising a plurality of stacked graphene layers separated from one another by an ion gel, wherein the ion gel is intercalated between adjacent graphene layers such that ions within the ion gel are able to arrange themselves at the surfaces of the graphene layers to cause a detectable change in one or more of an electrical and optical property of the graphene layers when a gate voltage is applied to a gate electrode in proximity to the ion gel.

2. The multilayer graphene composite of claim 1, wherein the graphene layers of the stack are in the form of one or more of a graphite crystal, single layers of graphene, and a percolation network of graphene flakes.

3. An apparatus comprising the multilayer graphene composite of claim 1, and a gate electrode in proximity to the ion gel configured to cause a detectable change in the transparency of the graphene layers, and switch between an opaque state, and a transparent state.

4. The apparatus of claim 3, wherein the apparatus comprises source and drain electrodes configured to enable a flow of electrical current from the source electrode through the plurality of stacked graphene layers to the drain electrode, and wherein the apparatus is configured such that the arrangement of ions at the surfaces of the graphene layers in response to the applied gate voltage causes a detectable change in the flow of electrical current.

5. The apparatus of claim 4, wherein the apparatus comprises a ground electrode configured to supply the plurality of stacked graphene layers with electric charge, and wherein the apparatus is configured such that the arrangement of ions at the surfaces of the graphene layers in response to the applied gate voltage causes a detectable change in the transparency of the graphene layers.

6. The apparatus of claim 5, wherein the ground electrode comprises one or more of the source and drain electrodes.

7. The apparatus of claim 3, wherein the apparatus has one of a side-gate configuration in which the gate electrode is adjacent to the plurality of graphene layers, and a top-gate configuration in which the gate electrode overlies the plurality of graphene layers.

8. The apparatus of claim 3, wherein the gate electrode is one or more of in contact with the ion gel of the multilayer graphene composite, and at least partially immersed in the ion gel of the multilayer graphene composite.

9. The apparatus of claim 3, wherein the gate electrode is configured to have a surface area which is substantially the same as the combined surface area of the plurality of graphene layers.

10. The apparatus of claim 3, wherein the gate electrode is capacitively coupled to a multilayer graphene composite comprising a plurality of stacked graphene layers separated from one another by an intercalating ion gel.

11. The apparatus of claim 3, wherein the gate electrode comprises one or more of pores and protrusions configured to increase its surface area.

12. An apparatus, comprising:
a plurality of stacked graphene layers separated from one another by an ion gel, wherein the ion gel is intercalated between adjacent graphene layers; and
a gate electrode in proximity to the ion gel and capacitively coupled to the graphene layers, the gate electrode configured to cause a detectable change in the transparency of the graphene layers by switching the graphene layers between an opaque state and a transparent state;
wherein ions within the ion gel are able to arrange themselves at the surfaces of the graphene layers to cause the detectable change in the transparency of the graphene layers when a gate voltage is applied to the gate electrode.

13. An apparatus, comprising:
a plurality of stacked graphene layers separated from one another by an ion gel, wherein the ion gel is intercalated between adjacent graphene layers;
a gate electrode in proximity to the ion gel and configured to cause a detectable change in the graphene layers, the gate electrode comprising one or more of pores and protrusions configured to increase a surface area of the gate electrode;
wherein ions within the ion gel are able to arrange themselves at the surfaces of the graphene layers to cause the detectable change in one or more of an electrical and optical property of the graphene layers when a gate voltage is applied to the gate electrode.

14. A method comprising: forming a multilayer graphene composite comprising a plurality of stacked graphene layers separated from one another by an ion gel, wherein the ion gel is intercalated between adjacent graphene layers such that ions within the ion gel are able to arrange themselves at the surfaces of the graphene layers to cause a detectable change in one or more of an electrical and optical property of the graphene layers when a gate voltage is applied to a gate electrode in proximity to the ion gel.

15. The method of claim 14, wherein forming the multilayer graphene composite comprises one of mixing graphene ink with an ion gel to produce a solution-processable composite usable to print the multilayer graphene composite, and the repeated and sequential deposition of a graphene layer followed by an ion gel layer.

16. A method comprising: applying a gate voltage to a gate electrode in proximity to an ion gel of a multilayer graphene composite, the multilayer graphene composite comprising a plurality of stacked graphene layers separated from one another by the ion gel, wherein the ion gel is intercalated between adjacent graphene layers such that ions within the ion gel are able to arrange themselves at the surfaces of the graphene layers to cause a detectable change in one or more of an electrical and optical property of the graphene layers when the gate voltage is applied to the gate electrode.

* * * * *